US009376750B2

(12) United States Patent
George et al.

(10) Patent No.: US 9,376,750 B2
(45) Date of Patent: Jun. 28, 2016

(54) METHOD OF DEPOSITING AN INORGANIC FILM ON AN ORGANIC POLYMER

(75) Inventors: Steven M. George, Boulder, CO (US); John D. Ferguson, Broomfield, CO (US); Alan W. Weimar, Niwot, CO (US); Christopher A. Wilson, Boulder, CO (US)

(73) Assignee: Regents of the University of Colorado, a Body Corporate, Denver, CO (US)

(*) Notice: Subject to any disclaimer, the term of this patent is extended or adjusted under 35 U.S.C. 154(b) by 246 days.

(21) Appl. No.: 10/482,627

(22) PCT Filed: Jul. 16, 2002

(86) PCT No.: PCT/US02/22742
§ 371 (c)(1),
(2), (4) Date: Dec. 26, 2003

(87) PCT Pub. No.: WO03/008110
PCT Pub. Date: Jan. 30, 2003

(65) Prior Publication Data
US 2004/0194691 A1    Oct. 7, 2004

Related U.S. Application Data

(60) Provisional application No. 60/306,521, filed on Jul. 18, 2001.

(51) Int. Cl.
| | |
|---|---|
| C30B 28/00 | (2006.01) |
| C23C 16/44 | (2006.01) |
| B01J 31/06 | (2006.01) |
| B82Y 30/00 | (2011.01) |
| C08J 7/04 | (2006.01) |
| C23C 16/02 | (2006.01) |
| C23C 16/14 | (2006.01) |
| C23C 16/34 | (2006.01) |
| C23C 16/40 | (2006.01) |
| C23C 16/442 | (2006.01) |
| C23C 16/455 | (2006.01) |
| C09D 1/00 | (2006.01) |
| H01L 51/52 | (2006.01) |

(52) U.S. Cl.
CPC ........... *C23C 16/4417* (2013.01); *B01J 31/069* (2013.01); *B82Y 30/00* (2013.01); *C08J 7/045* (2013.01); *C09D 1/00* (2013.01); *C23C 16/0272* (2013.01); *C23C 16/14* (2013.01); *C23C 16/34* (2013.01); *C23C 16/403* (2013.01); *C23C 16/442* (2013.01); *C23C 16/45525* (2013.01); *C23C 16/45555* (2013.01); *B01J 2231/12* (2013.01); *B01J 2231/70* (2013.01); *H01L 51/5237* (2013.01)

(58) Field of Classification Search
CPC .................................. B01J 2/006; B01J 8/00
USPC .............. 427/96.8, 212, 213, 255.395, 255.5, 427/255.6, 255.7, 576
See application file for complete search history.

(56) References Cited

U.S. PATENT DOCUMENTS

| | | | |
|---|---|---|---|
| 3,597,579 A * | 8/1971 | Lumley | 219/121.12 |
| 4,269,682 A * | 5/1981 | Yano et al. | 204/418 |
| 5,271,969 A | 12/1993 | Ogura | |
| 5,273,942 A | 12/1993 | McCauley et al. | |
| 5,306,666 A | 4/1994 | Izumi | |
| 5,362,667 A * | 11/1994 | Linn et al. | 438/455 |
| 5,681,775 A | 10/1997 | Pogge | |
| 5,705,265 A | 1/1998 | Clough et al. | |
| 5,719,741 A * | 2/1998 | Imai et al. | 361/321.4 |
| 5,916,365 A | 6/1999 | Sherman | |
| 5,985,175 A | 11/1999 | Fan et al. | |
| 6,042,929 A * | 3/2000 | Burke et al. | 428/141 |
| 6,143,659 A | 11/2000 | Leem | |
| 6,200,893 B1 | 3/2001 | Sneh | |
| 6,203,613 B1 * | 3/2001 | Gates et al. | 117/104 |
| 6,440,541 B1 | 8/2002 | Humphrey et al. | |
| 6,475,276 B1 | 11/2002 | Elers et al. | |
| 6,664,186 B1 * | 12/2003 | Callegari et al. | 438/681 |
| 6,946,086 B2 | 9/2005 | Foulger et al. | 252/586 |
| 2001/0031379 A1 | 10/2001 | Tera et al. | |
| 2001/0052752 A1 | 12/2001 | Ghosh et al. | |
| 2002/0003403 A1 | 1/2002 | Ghosh et al. | |
| 2002/0086307 A1 * | 7/2002 | Amin et al. | 435/6 |

FOREIGN PATENT DOCUMENTS

| | | | |
|---|---|---|---|
| JP | 60103024 | * | 6/1985 |
| JP | 2001-284042 A2 | | 10/2001 |
| WO | WO0182390 A1 | | 11/2001 |
| WO | WO02/071506 A1 | | 9/2002 |

OTHER PUBLICATIONS

The Merriam-Webster's Collegiate Dictionary, tenth edition, the definition of a term "adsorption".*
Ott et al., "Atomic Layer-controlled growth of transparent conducting ZnO on plastic substrates", Materials Chemistry and Physics 58 (1999) 132-138.
Klaus et al., Atomic Layer Cantrolled Growth of SIO2 Films Using Binary Reaction Sequence Chemistry, Appl. Phys. Lett. 70, 1092-1094 (1997).
Dillon et al., Surface Chemistry of AL2O3 Deposition Using AL(CH3)3 and H2O in a Binary Reaction Sequence, Surface Science 322, 230-242 (1995).
Sneh et al., Atomic Layer Growth of SIO2 on IS(100) Using SICL4 and H2O in a Binary Reaction Sequence, Surface Science 344, 135-152 (1995).
Rony, Diffusion Kinetics Within Supported Liquid-Phase Catalysts, Journal of Catalysis 14, 142-147 (1969).
Yin et al., Study of Supported Liquid Phase Catalysts for Hydroformylation of Olefins Contained in FCC Dry Gas, Beijing, China, vol. 2. 614-620 (1991).
Kolodziej et al., A Study of the Internal Diffusion of Gases in Porous Catalysts in the Presence of a Liquid Phase, Chemical Engineering and Processing. 31. 255-261 (1992).
Jelles et al., Supported Liquid Phase Catalysts, Studies in Surface Science and Catalysis, vol. 116, 667-674 (1998).
Freeman et al., Thermal Destruction of Hazardous Waste—A State of the Art View, Journal of Hazardous materials 14, 103-117 (1987).
Brusewitz et al., Problems in Use of Supported Liquid-Phase Catalysts in Fluidized Bed Reactors, Chem. Eng. Technol. 15, 385-389 (1992).

(Continued)

*Primary Examiner* — Elena T Lightfoot
(74) *Attorney, Agent, or Firm* — Arendt & Associates IP Group; Jacqueline Arendt

(57) ABSTRACT

Inorganic materials are deposited onto organic polymers using ALD methods. Ultrathin, conformal coatings of the inorganic materials can be made in this manner. The coated organic polymers can be used as barrier materials, as nanocomposites, as catalyst supports, in semiconductor applications, in coating applications as well as in other applications.

9 Claims, No Drawings

(56) References Cited

OTHER PUBLICATIONS

Upadhye, Molten Salt Destruction of Energetic Material Wastes as an Alternative to Open Burning, Chemistry for the Protection of the Environment 2, 267-276 (1996).
Upadhye, Molten Salt Takes the Bang Out of High Explosives, http://www.llnl.gov/str/upadhye.html, 1-4 (2000).
Greenburg, Method of Catalytically Inducing Oxidation of Carbonaceous Materials by the Use of Molten Salts, U.S. Pat. No. 3647358 (1972).
Hoffmeister et al., The Influence of the Pore Structure of the Support on the Properties of Supported Liquid-Phase Catalysts, Chem. Engineering Science. vol. 45. No. 8. 2575-2580 (1990).
Deal et al., Electrical Properties of Vapor-Deposited Silicon Nitrate . . . , Mar. 1968, J. Electrochem. Soc., pp. 300-307.
Van Cauwelaert et al., Infra-Red Spectroscopic Study of the Absorption of . . . , Jun. 1971, Laboratorium voor Oppervlaktescheikunde, pp. 66-76.
Goto et al., Dielectric Properties of Chemically Vapor-Deposited Si3N4, 1989, Journal of Materials Science 24, pp. 821-826.
Blitz et al., The Role of Amine Structure on Catalytic Activity . . . , 1988, Journal of Colloid and Interface Science—vol. 26—No. 2, pp. 387-392.
Blitz et al., Ammonia-Catalyzed Silylation Reactions of CAB-O-SIL With Methoxymethylsilanes, 1987, J. Am. Chem. Soc., pp. 7141-7145.
Adams et al., The Deposition of Silicon Dioxide Films at Reduced Pressure, Jun. 1979, J. Electrochem. Soc. pp. 1042-1046.
Wanatabe et al., The Properties of LPCVD SiO2 Film . . . , Dec. 1981, J. Electrochem. Soc. pp. 2630-2635.
Becker et al., Low Pressure Deposition of High-Quality SiO2 Films . . . , 1987, J. Vac. Sci. Technol. B 5 (6), pp. 1555-1563.
Kern et al., Advances Is Deposition Processes for Passivation Films, 1977, J. Vac. Sci. Technol.—vol. 14—No. 5, pp. 1082-1099.
Morishita et al., Atomic-Layer Chemical-Vapor-Deposition of SiO2 . . . , 1995, Jpn. J. Appl. Phys. vol. 34, pp. 5738-5742.
Morishita et al., New Substances for Atomic-Layer Deposition of Silicon Dioxide, 1995, Journal of Non-Crystalline Solids 187, pp. 66-69.
Tripp et al., Chemical Attachment of Chorosilanes to Silica . . . , 1993, J. phys. Chem. 97, pp. 5693-5698.
Ehrlich et al., Fast Room Temperature Growth of SiO2 Films . . . , 1991, Appl. Phys. Lett. 58 (23), pp. 2675-2677.
Klaus et al., Atomic Layer Controlled Growth of Si3N4 . . . , 1998, Surface Science, pp. L14-L19.
Klaus et al., Atomic Layer Deposition of SiO2 . . . , 2000, Surface Science 447, pp. 87-90.
Klaus et al., Atomic Layer Deposition of SiO2 . . . , 1999, Surface Review and Letters—vol. 6—Nos. 3 and 4, pp. 435-448.
Klaus et al., Growth of SiO2 at Room Temperature . . . , Dec. 1997, Science—vol. 278, pp. 1934-1936.
Kumagai et al., Fabrication of Titanium Oxide Thin Films . . . , 1995, Thin Solid Films 263, pp. 47-53.
Ritala et al., Studies on the Morphology of Al2O3 Thin Films . . . , 1996, Thin Solid Films 286, pp. 54-58.
Ritala et al., Growth of Titanium Dioxide Thin Films . . . , 1993, Thin Solid Films 225, pp. 288-295.
Han et al., A Near-Edge X-Ray Absorption Fine Structure Study of Atomic Layer Epitaxy . . . , 1998, Surface Science 415, pp. 251-263.
Morishita et al., Atomic-Layer Chemical-Vapor-Deposition of Silicon-Nitrate, 1997, Applied Surface Science 112, pp. 198-204.
Takahashi et al., Germanium Atomic Layer Epitaxy Controlled by Surface Chemical Reactions, Jun. 1989, Journal of Electrochem. Soc.—vol. 136—No. 6. pp. 1826-1827.
Gates et al., Epitalxial Si Films on Ge(100) Grown Via H/Cl Exchange, Feb. 1993, Applied Phys. Lett. 62 (5), pp. 510-512.
Ishii et al., Atomic Layer Epitaxy of AlP SNF its Application to . . . , 1997, Journal of Crystal Growth 180, pp. 15-21.
Juppo et al., Deposition of Copper Films by an Alternate Supply of CuCl and Zn, 1997, Journal of Vac. Sci. Technol. A 15(4), pp. 2330-2333.
Bell et al., Batch Reactor Kinetic Studies of Tungsten LPCVD . . . , Jan. 1996, Journal of Electochem. Soc.—vol. 143—No. 1, pp. 296-302.
Martensson et al., Atomic Layer Epitaxy of Copper on Tantalum, 1997, Chem. Vap. Deposition-3-No. 1, pp. 1-6.
Kumagai et al., Titanium Oxide/Aluminum Oxide Multilayer Reflectors . . . , May 1997, Applied Phys. Lett. 70 (18), pp. 2338-2340.
Kobayashi et al., In Situ Infrared Reflection and Transmission Absorbsion . . . , May 1993, Journal of Appl. Phys. 73 (9), pp. 4637-4643.
Kobayashi et al., Study on Mechanism of Selective Chemical Vapor Deposition . . . , Jan. 1991, Journal of appl. Phys. 69 (2), pp. 1013-1019.
Klaus et al., Atomic Layer Controlled Growth of SiO2 Films . . . , Mar. 1997, Applied Phys. Lett. 70 (9), pp. 1092-1094.
Klaus et al., Al3O3 Thin Film Growth on Si(100) Using Binary Reaction Sequence Chemistry, 1997, Thin Solid Films 292, pp. 135-144.
George et al., Surface Chemistry for Atomic Layer Growth, 1996, Journal of Phys. Chem 100, pp. 13121-13131.
Klaus et al., Atomic Layer Controlled Growth of Si3N4 Films . . . , 1998, Surface Science 418, pp. L14-L19.
Wu, Xi et al., Hydrodechlorination of $CCl_4$ over silia-supported $PdCl_2$-containing molten salt catalysts: The promotional effects of $CoCl_2$ and $CuCl_2$, *Journal of Catalysis*, 161 (1): 164-177, (Jun. 1996).
Jutka, et al., "Investigations on the use of supported liquid-phase catalysts in fluidized bed reactors," *Institute for Technology*, 88 (289): 122-129, (1994).
Johanson et al., "Elimination of hazardous wastes by the molten salt destruction process," Rockwell International, 234-242 (1991).
Stelman et al., "Treatment of mixed wastes by the molten salt oxidation process," Rockwell International, 795-799 (1992).
Ott, A.W., and Chang, R.P.H., "Atomic layer-controlled growth of transparent conducting ZnO on plastic substrates," *Materials Chemistry and Physics*, 58: 132-138 (1999).

\* cited by examiner

METHOD OF DEPOSITING AN INORGANIC FILM ON AN ORGANIC POLYMER

Organic polymers are used in countless applications because of their many desirable properties. Various polymers have desirable attributes for specific applications. Those attributes can include low cost, strength, insulating nature, biocompatibility and flexibility. However, there are many properties that could be improved by the addition of an inorganic film to the polymer surface.

For various reasons, inorganic coatings on polymers are expected to provide desirable properties. For example, the gas permeability through most polymers is quite high for gases such as hydrocarbons, $H_2O$ and $O_2$. This gas permeability affects the quality of polymers used for food and medical packaging. $H_2O$ and $O_2$ can diffuse into the package from the outside and degrade its contents. Inorganic films, such as $Al_2O_3$ and $SiO_2$ films are much less permeable than polymers. Such films could potentially form a diffusion barrier to prevent gas permeability in polymer films.

In the synthesis of polymeric panels for vehicles, construction or other applications requiring resistance to sunlight and the environment, inorganic films, such as $Al_2O_3$ and $SiO_2$ oxide films, can provide protection from ultraviolet light, heat, abrasion, and chemicals. Such films can be applied to the exterior of fabricated polymeric components to protect them from the environment.

For other applications, it would be desirable to deposit an adherent coating of a catalytic material onto an organic polymer, to form a supported catalyst. Such polymer-based catalysts would be useful for gas phase polymerization processing. Currently, silica or alumina is used as the catalyst supports. This leads to contamination of the new polymer with residual silica or alumina. This contamination could be minimized if the monolithic silica or alumina based catalyst supports could be replaced with a polymer support.

In the area of microelectronics, polymers are used as low dielectric constant (low k) insulating films. Deposition on these low k films is difficult. The deposition of an oxide layer on the polymer substrate surface may provide a base surface layer that allows deposition of other materials. One such material is titanium nitride, which is used as a copper diffusion barrier. The oxide layer may also facilitate the etching of metals more easily than could be achieved directly on the polymer surface.

Deposition of inorganic films on organic polymer surfaces is difficult. Chemical vapor deposition (CVD) methods usually cannot be used because the CVD temperatures are above the softening or pyrolysis temperatures for the polymers. Physical sputtering or plasma deposition can be employed at low temperatures to form oxide films such as $Al_2O_3$ or $SiO_2$. However, sputtering requires line-of-sight to the polymer surface and is not effective for shadowed structures or particles. Plasma deposition involves high-energy particles that can damage and corrode the polymer surface. Both sputtering and plasma deposition also leave defects and pinholes in the deposited inorganic film that provide paths for $H_2O$ and $O_2$ gas diffusion through the inorganic film. Both of these characteristics are important for applications in food and medical packaging that require a transparent diffusion barrier on the polymer surface.

In addition, sputtering requires a special apparatus and high maintenance sputtering targets. More significantly, sputtering can coat only a limited area and requires line-of-sight to the polymer surface. Therefore, sputtering is not effective for coating shadowed structures or particles. Plasma deposition also requires a plasma generation source and involves high-energy species. Although these species can react with the polymer and functionalize the surface, they can also corrode the polymer. Consequently, the plasma deposition of oxide films can damage the underlying organic polymer substrate.

It would be desirable to provide a method to deposit very thin coatings of inorganic materials onto polymer substrates. It would further be desirable to provide organic polymers having thin deposits of inorganic materials adhered to the polymer.

The invention is in one aspect a method for depositing an inorganic material on a polymer substrate material comprising, conducting a sequence of at least two self-limiting reactions at the surface of said polymer substrate to deposit the inorganic material onto the surface of said polymer substrate.

In another aspect, the invention is a polymer substrate having deposited thereon an inorganic material in the form of a film or discrete particles having a thickness of 200 nm or less. In preferred aspects, the inorganic material acts as an adhesion layer upon which a second inorganic material is deposited. The adhesion layer permits the deposition of materials that otherwise adhere poorly to the polymer substrate.

In a third aspect, the invention is a nanocomposite prepared from the polymer substrate of the second aspect.

In a fourth aspect, the invention is a fabricated article made from the polymer substrate of the second aspect.

In a fifth aspect, the invention is a semiconductor device comprising a copper or aluminum interconnect insulated with the polymer substrate of the second aspect.

In this invention, an inorganic material is deposited onto the surface of an organic polymer using an atomic layer deposition ("ALD"; also known as ALE—"atomic layer epitaxy"). ALD techniques permit the formation of inorganic deposits approximately equal to the molecular spacing of the inorganic material, typically up to about 0.3 nm of thickness per reaction cycle. In the ALD process, the inorganic deposit is formed in a series of two or more self-limited reactions, which in most instances can be repeated to sequentially form additional material until the inorganic deposit achieves a desired size or thickness (such as in the case of a film).

A wide variety of polymers may be used as substrates. The substrate polymer may be thermoplastic or thermosetting, crosslinked or non-crosslinked, and if not crosslinked, linear or branched. Further, the substrate polymer may exist in any physical form at the time the inorganic material is deposited, provided that the temperature is such that the substrate polymer is a solid. For example, the substrate polymer may be a particulate material having any desirable particle size, such as, for example, about from 0.001 micron, preferably from about 0.05 micron and more preferably from about 1 micron, to 1 millimeter or more, especially to about 200 microns and more preferably to about 50 to 200 microns. Preferred particulate polymers have surface areas in the range of about 0.1 to 200 $m^2/g$ or more.

Polymer films are substrates of particular interest, such as monolayer or multilayer films (that may be prepared by coextrusion processes, for example) having a thickness of 0.0005 to about 0.010 inches. Polymer sheets having thicknesses of 0.010 inches or more are useful substrates as well. Molded articles of all types (made by any applicable molding process, such as extrusion, compression molding, vacuum forming, thermoforming, injection molding, and the like) may be used as substrates.

The chemical composition of the substrate polymer may vary widely. Substrate polymers that contain functional groups such as halogen, hydroxyl, carbonyl, carboxylic acid, primary amine, secondary amine and the like are useful, as these functional groups provide sites at which it is possible to form chemical bonds between the polymer and the inorganic material. Examples of polymers having such functional groups are polyurethanes; polyesters (aliphatic and/or aromatic, including polyethylene terephthalate), epoxy resins, epoxy-novalac resins, phenolic resins, cellulose ethers and esters (such as hydroxyethyl cellulose, hydroxypropyl cellulose, methyl cellulose, methyl hydroxylpropyl cellulose, and the like), polyvinyl alcohol, polyvinyl chloride, polyamides (such as the various nylons), polyamines, polyvinylidene chloride, halogenated or aminated poly(alkenyl aromatic) polymers, polyacrylic acid, polyacrylates, especially polymers or copolymers of an hydroxyalkyl ester of acrylic or methacrylic acid; polyacrylamide; polyimides, polycarbonates and the like. In the cases of certain thermosetting resins such as phenolic, epoxy and epoxy-novalac resins, a solid B-staged resin can be used as the substrate, as well as the fully cured resin.

However, polymers that do not contain such functional groups are also useful as substrates. Among polymers of this type are the polyolefins, such as low density polyethylene, linear low density polyethylene, substantially linear polyethylene, high density polyethylene, polypropylene, polybutylene, and various copolymers of monoalkenes; poly(alkenyl aromatic) polymers such as polystyrene and poly(naphthalene); polymers of conjugated dienes such as polybutadiene, isoprene, and the like; PTFE, as well as block and/or random copolymers of any of the foregoing. Organosilicone polymers are likewise useful.

It is possible in some instances to perform a precursor reaction to introduce desirable functional groups onto the surface of the polymer substrate. Depending on the particular polymer, techniques such as water plasma treatment, ozone treatment, ammonia treatment and hydrogen treatment are among the useful methods of introducing functional groups.

The polymer substrate should be treated before initiating the reaction sequence to remove volatile materials that may be absorbed onto the surface. This is readily done by exposing the substrate to elevated temperatures and/or vacuum. The polymer substrate is then sequentially contacted with gaseous reactants. The reactions are performed at a temperature below that at which the organic polymer degrades, melts, or softens enough to lose its physical shape. Many polymers degrade, melt or soften at moderately elevated (e.g., 400-550K) temperatures. The temperature at which the ALD reactions are conducted is therefore generally below 550K, and preferably below 400K, more preferably below about 373K, and especially below 350K, with the upper temperature limit being dependent on the particular organic polymer to be coated. The reactants are gasses at the temperature the reactions are conducted. Particularly preferred reactants have vapor pressures of at least 10 torr or greater at a temperature of 300K. In addition, the reactants are selected such that they can engage in the reactions that form the inorganic material at the temperatures stated above. Catalysts may be used to promote the reactions at the required temperatures.

At close to the softening temperature, the chains in the polymer are in thermal agitation and mobile. Pyrolysis of the polymer begins to degrade the polymer by desorbing monomers from the polymer. This loss of monomers exposes free radical carbon chains close to the surface of the polymer. The thermal motion of the polymer chains and desorption of monomer units from the polymer is believed to provide functional groups on the surface of the polymer of reaction with the ALD reactants. Further, adsorption of the ALD reactants is believed to be facilitated by the polymer chain mobility. Thus, conducting the ALD reaction sequences at elevated temperatures close to but below the softening temperature of the polymer substrate is desirable in some instances.

The polymer substrate is generally held in a chamber that can be evacuated to low pressures. Each reactant is introduced sequentially into the reaction zone, typically together with an inert carrier gas. Before the next reactant is introduced, the reaction by-products and unreacted reagents are removed. This can be done, for example, by subjecting the substrate to a high vacuum, such as about $10^{-5}$ torr or lower, after each reaction step. Another method of accomplishing this, which is more readily applicable for industrial application, is to sweep the substrate with an inert purge gas between the reaction steps. This purge gas can also act as a carrier for the reagents. The next reactant is then introduced, where it reacts at the surface of the substrate. After removing excess reagents and reaction by-products, as before, the reaction sequence can be repeated as needed to build inorganic deposits of the desired size or thickness.

General methods for conducting ALD processes are described, for example, in J. W. Klaus et al, "Atomic Layer Controlled Growth of $SiO_2$ Films Using Binary Reaction Sequence Chemistry", *Appl. Phys. Lett.* 70, 1092 (1997) and O. Sheh et al., "Atomic Layer Growth of $SiO_2$ on Si(100) and $H_2O$ using a Binary Reaction Sequence", *Surface Science* 334, 135 (1995).

A convenient method for depositing the inorganic material onto a particulate polymer substrate is to form a fluidized bed of the particles, and then pass the various reagents in turn through the fluidized bed under reaction conditions. Methods of fluidizing particulate materials are well known, and generally include supporting the particles on a porous plate or screen. A fluidizing gas is passed upwardly through the plate or screen, lifting the particles somewhat and expanding the volume of the bed. With appropriate expansion, the particles behave much as a fluid. The reagents can be introduced into the bed for reaction with the surface of the particles. In this invention, the fluidizing gas also can act as an inert purge gas for removing unreacted reagents and volatile or gaseous reaction products and as a carrier for the reagents. In the case of fluidizing extremely fine particles, vibration can be applied to assist in the fluidization process. Vibrational forces are beneficial to overcome interparticle van der Waals forces that tend to prevent fluidization and promote a plug flow of particles in the bed. Ultra-fine, in particular, submicron and small micron sized-particles tend to form particle agglomerates that maintain fluidization in the bed and are not carried out with the outflowing gas. Applying vibrational forces allows each primary particle in the bed to be coated individually instead of merely coating the agglomerate.

Another method for depositing the inorganic material onto a particulate polymer substrate is through the use of a rotary tube reactor. The rotary tube reactor comprises a hollow tube that contains the particulate polymer. The tube reactor is held at an angle to the horizontal, and the particulate polymer passes through the tube through gravitational action. The tube angle determines the flow rate of the particulate through the tube. The tube is rotated in order to distribute individual particles evenly and expose all particles to the reactants. The tube reactor design permits the particulate polymer to flow in a near plug-flow condition, and is particularly suitable for continuous operations. The reactants are introduced individually and sequentially through the tube, preferentially countercurrent to the direction of the particulate polymer.

Polymer particles treated according to the invention preferably are non-agglomerated. By "non-agglomerated", it means that the particles do not form significant amounts of agglomerates during the process of coating the substrate particles with the inorganic material. Particles are considered to be non-agglomerated if (a) the average particle size does not increase more than about 5%, preferably not more than about 2%, more preferably not more than about 1% (apart from particle size increases attributable to the coating itself) as a result of depositing the coating, or (b) if no more than 2 weight percent, preferably no more than 1 weight % of the particles become agglomerated during the process of depositing the inorganic material.

Because the reaction precursors are all in the gas phase, the ALD process is not a "line-of-sight" method of depositing the multiple bilayers. Instead, the reactants can cover all surfaces of the substrate, even if those surfaces are not in the direct path of the precursors as they are brought into the reaction chamber and removed. Further, as the reactions are self-limiting, and the precursors form only monolayer deposits on the substrate surface during each exposure, the resulting deposit that is applied per reaction cycle is highly uniform in thickness. This permits the formation of high quality deposits on surfaces of substrates that have a wide range of geometries.

The selection of reactants is important in obtaining good adhesion of the inorganic material. At least one of the reactants is preferably one that which, if contacted in bulk with the polymer substrate, will wet the surface of the polymer substrate (a 'wetting' reactant). If the polymer substrate contains functional groups, the first reactant may also be reactive with those functional groups at the reaction temperatures described before, thereby forming a surface species that is chemically bonded to the polymer and capable of engaging in further reactions to form the inorganic material.

Although the invention is not limited to any theory, it is believed that a wetting reactant will sorb onto the surface of the polymer substrate when applied under ALD conditions. The wetting reactant tends to penetrate somewhat beneath the surface of the polymer, such as into small pores or imperfections in the polymer surface, or even between polymer chains at a molecular level. Wetting reactant molecules thus sorbed onto the polymer surface to create sites at which the other reactants can attach and react to form the inorganic material. If one of the ALD reactants will sorb onto the polymer surface, it is possible to conduct the ALD reaction sequence and form adherent inorganic coatings, even if one or more of the other ALD reactants does not wet the polymer surface. For example, ALD sequences that use water as a reactant can be successfully conducted even on highly non-polar substrates such as polyolefins or organosilicones, if a wetting reactant such as trimethyl aluminum is used.

Because the polymer surface tends to have small pores and imperfections, the inorganic material often is deposited discontinuously or unevenly at first, until a number of reaction cycles have been completed. However, as more reaction cycles are repeated, individual deposits of inorganic material tend to grow together and interconnect to form a continuous coating. Thus, by selection of the polymer substrate and the number of times the ALD reaction sequence is conducted, the inorganic deposits may be formed as a plurality of individual particles or a continuous or semi-continuous film. It is believed, again without limiting the invention to any theory, that by interconnecting individual deposits of inorganic material that are formed in the first few reaction cycles, the inorganic material forms "bridges" between these deposits. These "bridges" can mechanically interlock with the polymer substrate (at a molecular or larger scale) and secure the inorganic deposits to the substrate in that manner. This mechanical interlocking may be supplemented by chemical bonding in cases where the polymer has functional groups that can form bonds to one or more of the ALD reactants. This effect is illustrated in Examples 2-4 below, in which large reactant uptakes are seen during early reaction cycles, followed by smaller uptakes during later reaction cycles as a continuous inorganic film is created and the reactants can no longer penetrate into pores in the polymer substrate.

Trimethylaluminum (TMA) is sorbed well onto a wide variety of polymer substrates, including nonpolar polymers such as polyolefins, poly (alkenyl aromatics) and organo silicone polymers. As such, an ALD process using TMA as a reactant is particularly suitable for depositing inorganic materials onto a wide range of organic polymers. TMA ALD reactions usually form alumina ($Al_2O_3$); an illustrative example of an overall reaction of this type is $2Al(CH_3)_3 + 3H_2O \rightarrow Al_2O_3 + 6CH_4$. In the ALD process, this reaction is conducted as half-reactions as follows (following initial introduction of TMA onto the polymer surface):

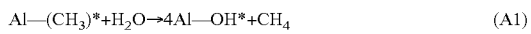

$$Al-(CH_3)^* + H_2O \rightarrow 4Al-OH^* + CH_4 \qquad (A1)$$

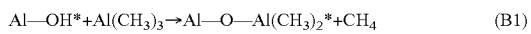

$$Al-OH^* + Al(CH_3)_3 \rightarrow Al-O-Al(CH_3)_2^* + CH_4 \qquad (B1)$$

The asterisk (*) indicates a species at the surface of the inorganic material. This particular sequence of reactions to deposit alumina is particularly preferred, as the reactions can proceed at temperature below 350K. This particular reaction sequence tends to deposit $Al_2O_3$ at a rate of ~1.2 Å per AB cycle. On polymer substrates, a somewhat greater rate of growth is often seen, especially during the first 25-50 AB reaction cycles. This is believed to be due to the penetration of the TMA into the polymer substrate and formation of discontinuous $Al_2O_3$ deposits during the initial reaction cycles. Triethyl aluminum (TEA) can also be used in place of TMA in the reaction sequence.

Many ALD reaction sequences do not include a good wetting reactant. It is still possible in such cases to deposit the desired inorganic material onto the polymer substrate. One way of accomplishing this is to deposit a "precursor" inorganic material onto the substrate, via an ALD reaction sequence that includes a good wetting reactant. Reactive species on the precursor inorganic material can become reactive sites at which a second ALD sequence can be initiated to deposit the desired inorganic material. A particularly suitable "precursor" inorganic material is alumina, which is preferably deposited using reaction sequence A1/B1 above. As few as two repetitions of a reaction cycle forming a "precursor" inorganic material can be used. A preferred number of reaction cycles to deposit a "precursor" inorganic material is from 2 to about 200 cycles, especially from about 5 to about 25 reaction cycles.

Examples of binary reaction sequences for producing metal layers are described in copending application Ser. No. 09/523,491 entitled "A Solid Material Comprising a Thin Metal Film on its Surface and Methods for Producing the Same". A specific reaction scheme described therein involves sequential reactions of a substrate surface with a metal halide followed by a metal halide reducing agent. The metal of the metal halide is preferably a transition metal or a semimetallic element, including tungsten, rhenium, molybdenum, antimony, selenium, tellurium, platinum, ruthenium and iridium. The halide is preferably fluoride. The reducing agent is suitably a silylating agent such as silane, disilane, trisilane and mixtures thereof. Other suitable reducing agents are boron hydrides such as diborane.

For depositing a tungsten coating, for instance, the overall reaction, $WF_6 + Si_2H_6 \rightarrow W + 2SiF_3H + 2H_2$, can be split into a sequence of reactions represented as follows. As neither of the reactants is a good wetting reactant, an alumina adhesion layer can be formed first as described above. The alumina layer will contain Al—OH surface species that form sites to initiate the tungsten-forming reactions $$\text{Al—OH* (substrate surface)} + Si_2H_6 \rightarrow \text{Al—O—SiH}_3^* + SiH_4$$

$$\text{Al—O—SiH}_3^* + WF_6 \rightarrow \text{Al—O—WF}_5^* + SiFH_3 \quad \text{(precursor reactions)}$$

$$\text{Al—O—WF}_5^* + Si_2H_6 \rightarrow \text{Al—O—W—SiF}_2H^* + SiF_3H + 2H_2 \tag{A2}$$

$$\text{Al—O—W—SiF}_2H^* + WF_6 \rightarrow \text{Al—O—W—WF}_5 + SiF_3H \tag{B2}$$

The asterisk (*) indicates the species that resides at the surface of the substrate or applied film. Once the precursor reaction is completed, reactions A2 and B2 are alternatively performed until a tungsten layer of desired thickness is formed.

Another binary reaction scheme suitable for depositing a metal ($M^2$) film on an alumina adhesion layer can be represented as:

$$\text{Al*—O—H (substrate surface)} + M^2X_n \rightarrow \text{Al—O-}M^{2*}X_{n-1} + HX \quad \text{(precursor reaction)}$$

$$\text{Al—O-}M^2X^* + H_2 \rightarrow \text{Al—O-}M^2\text{-H}^* + HX \tag{A_3}$$

$$\text{Al—O-}M^2\text{-H}^* + M^2(acac) \rightarrow \text{Al—O-}M^2\text{-}M^{2*}(acac) + H(acac) \tag{B3}$$

"Acac" refers to acetylacetonate ligand, and X is a displaceable nucleophilic group. Also as before, the asterisk (*) refers to the species residing at the surface. By heating to a sufficient temperature, hydrogen bonded to the surface as $M^2$-H will thermally desorb from the surface as $H_2$, thereby generating a final surface composed of $M^2$ atoms. Cobalt, iron and nickel are preferred metals for coating according to reaction sequence A3/B3.

Oxide layers can be prepared on an underlying substrate or layer having surface hydroxyl or amine groups using a binary (AB) reaction sequence as follows. In the sequences below, R represents an atom on the surface of the polymer substrate. In the case where an alumina or other adhesion layer is used, R represents a metal atom (aluminum in the case where the adhesion layers is alumina). If no adhesion layer is used, R represents an atom on the polymer. The asterisk (*) indicates the atom that resides at the surface, and Z represents oxygen or nitrogen (oxygen in the case where an alumina adhesion layer is used). $M^1$ is an atom of the metal (or semimetal such as silicon), particularly one having a valence of 3 or 4, and X is a displaceable nucleophilic group. The reactions shown below are not balanced, and are only intended to show the reactions at the surface of the particles (i.e., not inter- or intralayer reactions).

$$R—Z—H^* + M^1X_n \rightarrow R—Z-M^1X_{n-1}^* + HX \tag{A4}$$

$$R—Z-M^1X^* + H_2O \rightarrow R—Z-M^1OH^* + HX \tag{B4}$$

In reaction A4, reagent $M^1X_n$ reacts with the R*—Z—H groups on the surface to create a new surface group having the form -$M^1$-$X_{n-1}$. $M^1$ is bonded through one or more Z (nitrogen or oxygen) atoms. The -$M^1$-$X_{x-1}$ group represents a site that can react with water in reaction B4 to regenerate one or more hydroxyl groups. The hydroxyl groups formed in reaction B4 can serve as functional groups through which reactions A4 and B4 can be repeated, each time adding a new layer of $M^1$ atoms. Note that in some cases (such as, e.g., when $M^1$ is silicon, zirconium, titanium, boron or aluminum) hydroxyl groups can be eliminated as water, forming $M^1$-O-$M^1$ bonds within or between layers. This condensation reaction can be promoted if desired by, for example, annealing at elevated temperatures and/or reduced pressures.

Binary reactions of the general type described by equations A4 and B4, where $M^1$ is silicon, are described more fully in J. W. Klaus et al, "Atomic Layer Controlled Growth of $SiO_2$ Films Using Binary Reaction Sequence Chemistry", *Appl. Phys. Lett.* 70, 1092 (1997) and O. Sheh et al., "Atomic Layer Growth of $SiO_2$ on Si(100) and $H_2O$ using a Binary Reaction Sequence", *Surface Science* 334, 135 (1995). Binary reactions of the general type described by equations A4 and B4, where $M^1$ is aluminum, are described in A. C. Dillon et al, "Surface Chemistry of $Al_2O_3$ Deposition using $Al(CH_3)_3$ and $H_2O$ in a Binary reaction Sequence", *Surface Science* 322, 230 (1995) and A. W. Ott et al., "$Al_2O_3$ Thin Film Growth on Si(100) Using Binary Reaction Sequence Chemistry", *Thin Solid Films* 292, 135 (1997). General conditions for these reactions as described therein can be adapted to construct $SiO_2$ and $Al_2O_3$ coatings on particulate materials in accordance with this invention. Analogous reactions for the deposition of other metal oxides such as, $TiO_2$ and $B_2O_3$ are described in Tsapatsis et al. (1991) *Ind. Eng. Chem. Res.* 30:2152-2159 and Lin et al., (1992), *AIChE Journal* 38:445-454.

Other reaction sequences can be performed to produce nitride and sulfide coatings. An illustrative reaction sequence for producing a nitride coating is:

$$R—Z—H^* + M^1X_n \rightarrow R—Z-M^1X_{n-1}^* + HX \tag{A5}$$

$$R—Z-M^1X^* + NH_3 \rightarrow R—Z-M^1NH_2^* + HX \tag{B5}$$

Ammonia can be eliminated to form $M^1$-N-$M^1$ bonds within or between layers. This reaction can be promoted if desired by, for example, annealing at elevated temperatures and/or reduced pressures.

An illustrative reaction sequence for producing a sulfide coating is:

$$R—Z—H^* + M^1X_n \rightarrow R—Z-M^1X_{n-1}^* + HX \tag{A6}$$

$$R—Z-M^1X^* + H_2S \rightarrow R—Z-M^1SH^* + HX \tag{B6}$$

Hydrogen sulfide can be eliminated to form $M^1$-S-$M^1$ bonds within or between layers. As before, this reaction can be promoted by annealing at elevated temperatures and/or reduced pressures.

A suitable binary reaction scheme for depositing an inorganic phosphide coating is described in Ishii et al, *Crystal. Growth* 180 (1997) 15.

In the foregoing reaction sequences, suitable replaceable nucleophilic groups will vary somewhat with $M^1$, but include, for example, fluoride, chloride, bromide, alkoxy, alkyl, acetylacetonate, and the like. Specific compounds having the structure $M^1X_n$ that are of particular interest are silicon tetrachloride, tetramethylorthosilicate ($Si(OCH_3)_4$), tetraethylorthosilicate ($Si(OC_2H_5)_4$), trimethyl aluminum ($Al(CH_3)_3$), triethyl aluminum ($Al(C_2H_5)_3$), other trialkyl aluminum compounds, and the like.

In addition, catalyzed binary reaction techniques such as described in U.S. Pat. No. 6,090,442 are suitable for producing coatings, especially oxide, nitride or sulfide coatings, most preferably oxide coatings. Reactions of this type can be represented as follows:

$$R—OH + C_1 \rightarrow R—OH \ldots C_1 \tag{A7a}$$

$$R—OH \ldots C_1 + R^1\text{-}M^1\text{-}R^1 \rightarrow R—O\text{-}M^1\text{-}R^1 + R^1—H + C_1 \tag{A7b}$$

$$R\text{—}O\text{-}M^1\text{-}R^1 + C_2 \rightarrow R\text{—}O\text{-}M^1\text{-}R^1 \ldots C_2 \quad \text{(B7a)}$$

$$R\text{—}O\text{-}M^1\text{-}R^1 \ldots C_2 + H_2O \rightarrow R\text{—}O\text{-}M^1\text{-}OH + R^1\text{—}H + C_2 \quad \text{(B7b)}$$

$C_1$ and $C_2$ represent catalysts for the A7b and B7b reactions, and may be the same or different. Each $R^1$ represents a functional group (which may be the same or different), and M and $M^1$ are as defined before, and can be the same or different. Reactions A7a and A7b together constitute the first part of a binary reaction sequence, and reactions B7a and B7b together constitute the second half of the binary reaction sequence. An example of such a catalyzed binary reaction sequence is:

$$Al\text{—}OH^* \text{ (adhesion layer)} + C_5H_5N \rightarrow Al\text{—}OH \ldots C_5H_5N^* \quad \text{(A8a)}$$

$$Al\text{—}OH \ldots C_5H_5N^* + SiCl_4 \rightarrow Al\text{—}O\text{—}SiCl_3^* + C_5H_5N + HCl \quad \text{(A8b)}$$

$$Al\text{—}O\text{—}SiCl_3^* + C_5H_5N \rightarrow Al\text{—}O\text{—}SiCl_3 \ldots C_5H_5N^* \quad \text{(B8a)}$$

$$Al\text{—}O\text{—}SiCl_3 \ldots C_5H_5N^* + H_2O \rightarrow Al\text{—}O\text{—}H^* + C_5H_5N + HCl \quad \text{(B8b)}$$

where the asterisks (*) again denote atoms at the surface. This general method is applicable to forming various other coatings, including silica, zirconia or titania.

Several techniques are useful for monitoring the progress of the ALD reactions. For example, vibrational spectroscopic studies can be performed on high surface area silica powders using transmission Fourier transform infrared techniques. The deposited coatings can be examined using in situ spectroscopic ellipsometry. Atomic force microscopy studies can be used to characterize the roughness of the coating relative to that of the surface of the substrate. X-ray photoelectron spectroscopy and x-ray diffraction can by used to do depth-profiling and ascertain the crystallographic structure of the coating.

The inorganic deposits formed in the ALD process may take the form of individual particles or a continuous or semi-continuous film. The physical form of the deposits will depend on factors such as the physical form of the polymer substrate and the number of times the reaction sequence is repeated. It has been found that very often, the inorganic material formed in the first one or several reaction sequences tends to be deposited discontinuously. As the reaction sequences are continued, the initially discontinuous deposits will often become interconnected as further inorganic material is deposited.

In many preferred embodiments, the deposits of inorganic material form an ultrathin conformal coating. By "ultrathin", it is meant that the thickness of the coating is up to about 100 nm, more preferably from about 0.1 to about 50 nm, even more preferably from about 0.5-35 nm and most preferably from about 1 and about 20 nm. These thicknesses provide a flexible coating that provides good vapor and gas barrier properties. By "conformal" it is meant that the thickness of the coating is relatively uniform across the surface of the particle (so that, for example, the thickest regions of the coating are no greater than 3×, preferably no greater than 1.5× the thickness of the thinnest regions), so that the surface shape of the coated substrate closely resembles that of the underlying substrate surface. Conformality is determined by methods such as transmission electron spectroscopy (IEM) that have resolution of 10 nm or below. Lower resolution techniques cannot distinguish conformal from non-conformal coatings at this scale. The desired substrate surface is also preferably coated substantially without pinholes or defects.

The applied inorganic material can impart many desirable properties to the polymer substrate, depending on the particular substrate, inorganic material and end-use application. In many instances, the inorganic material forms a continuous film on the surface of the polymer substrate. This continuous film can form a barrier to diffusion of gasses and vapors such as hydrocarbons, water and oxygen, through the coated polymer. When the polymer substrate is a film, the coated polymer can be readily fabricated into packaging films, bags, bottles, other types of storage containers, gloves, protective clothing, or other types of products in which barrier properties are desired. These packaging materials are particularly suitable for packaging food, medicines or other materials that are prone to dehydration or oxidative degradation. The ultrathin inorganic layers form excellent diffusion barriers because the ultrathin films are quite flexible. The ultrathin films are therefore less susceptible to forming microcracks and thus becoming more gas permeable than thicker layers applied using other methods.

Good barrier properties are seen when a continuous film of inorganic material of a thickness of about 10 nm or more, preferably about 20-100 nm, and more preferably about 20-50 nm is deposited.

Alternatively, a barrier layer of the inorganic material may be applied using the aforementioned ALD methods to a previously-fabricated bag, bottle or other type of storage container, glove or protective article of clothing. Yet another way to make these articles is to deposit the inorganic coating on polymer particles, and then fabricate a polymer film on the article itself from the coated polymer particles. Combinations of these methods can be used to create a barrier layer that is dispersed throughout the polymer and also on the surface of the fabricated article.

Another application for which barrier properties are desirable are inflatable objects such as tennis balls, other athletic equipment, balloons, pneumatic tires and the like. Elastomeric polymers such as butyl rubber can be coated with an inorganic film according to the invention to form a material suitable as a barrier layer for such inflatable objects.

The deposited inorganic material may also serve as an adhesion layer, through which other inorganic materials can be adhered to the polymer substrate. In cases where the polymer has no functional groups that react with the ALD reactants, the deposition of an inorganic material such as alumina can provide such functional groups. Subsequent ALD reactions can take advantage of the functional groups provided by the first-deposited inorganic material, reacting with them to form a strong cohesive bond.

An example of such an embodiment is the deposition of a diffusion barrier layer such as TiN or TaN on low k dielectric polymers. Semiconductor devices often use aluminum alloy interconnects insulated with $SiO_2$ dielectric layers. As semiconductor devices are fabricated with smaller dimensions, the resistance capacitance (RC) time constant of the interconnects eventually limits the device speed. One strategy for reducing the RC time constant is to replace the aluminum with copper.

Further improvements in device performance are achieved by reducing the capacitance of the dielectric volume between the interconnect lines. This may be accomplished by changing from $SiO_2$ to a lower dielectric constant material (a "low-k" material). Organic polymers are being considered as low-k materials. A problem with using organic polymers as low-k materials is copper diffusion. Copper atoms can migrate from the interconnects through the organic polymer at high temperatures in the presence of electric fields and cause device failure. Diffusion barrier materials such as TiN may be deposited on the organic polymer prior to the copper deposition to prevent copper diffusion. The diffusion barrier material should be continuous and preferably is conformal to ensure a uniform coating.

The deposited inorganic material may provide an electrical insulating or conducting layer on the polymer substrate. Conducting polymers are used in a variety of electronic applications, such as organic light emitting diodes (OLEDs). These conducting polymers often need to be isolated from other conducting layers. OLED devices in particular need insulating layers to define proper device performance. A deposited film of inorganic material such as $Al_2O_3$ form an insulating layer on such conducting polymers. A deposited $Al_2O_3$ layer sandwiched between conducting polymer layers can provide a means for fabricating electron tunneling devices such as electroluminescent displays. The polymer substrate allows the display to be flexible.

An $Al_2O_3$/ZnO mixture can be used to define conducting layers with variable resistivity. The $Al_2O_3$/ZnO alloy system spans a full 18 orders of magnitude in resistivity, and so, if deposited on a nonconductive polymer substrate in accordance with this invention, it is possible to provide conducting layers of controllable conductivity onto a polymer substrate.

The deposited inorganic material may also improve some desired mechanical property of the polymer, such as impact strength, tensile strength and the like. The inorganic film can also provide corrosion resistance to the polymer substrate.

Polymer particles according to the invention may be formed into a dispersion in an aqueous and/or organic liquid phase for making coatings for a wide range of coating applications.

The deposited inorganic material in many cases can serve as a protective coating for the polymer substrate. For example, the coating in many cases imparts ultraviolet, chemical, or erosion barrier properties to the coated polymer. These barrier properties can improve or extend the useful life of polymers that are used as structural components in a wide variety of appliance, vehicle or construction applications, for example. The inorganic material may be deposited on molded parts made from a variety of structural and engineering polymers, or may be deposited onto polymer sheets or particles that are subsequently shaped to form the structural components.

Polymer particles made according to the invention are useful for making nanocomposites and/or organic/inorganic alloys. One way of making the nanocomposites is to melt process the coated particles. "Melt processing" involves any method by which the particles are melted together to form a molten mass, such as, for example, any extrusion or melt spinning or molding process. The molten mass may be formed directly into some desired article, or may be extruded and formed into pellets or particles for later fabrication. The melt processing intimately mixes the inorganic material into the polymer in the form of nano-scale particles. The melt-processed polymer may then be fabricated in any suitable manner to form a structural component for appliance, vehicle or construction applications, among others. The resulting nanocomposite will in most cases have higher impact strength than the neat polymer substrate. This method of forming nanocomposites overcomes many of the difficulties seen with conventional methods of making nanocomposites, because it is no longer necessary to defoliate the reinforcing material and disperse it into the polymer.

In other cases, the nano-dispersed particles can provide improved flame retardancy to the polymer. In particular, polymer particles according to the invention that have a deposited metal coating can be extruded to form a nanocomposite which, if combined with phosphorous-containing flame retarding compounds, have decreased polymer flammability and increased charring on fire testing. Oxide coatings applied to polymer particles according to the invention can result in similarly increased charring upon fire testing, with or without additional flame retardant.

In another application, the polymer particles coated according to the invention can be used to encapsulate electronic parts. Of particular interest are solid epoxy resins that are coated with alumina. The alumina layer enhances the compatibility of the polymer particles with various fillers such as AlN, BN or $Si_3N_4$. It is further possible to apply a coating of these nitrides to the polymer particles themselves (preferably using an alumina adhesion layer).

In yet another application, an active catalyst can be deposited onto the coated polymer particles of the invention to form a supported catalyst with the polymer particles as the support. Particularly suitable polymers for this purpose are crosslinked materials, in particular crosslinked polystyrene polymers as are used in gel- and/or macroporous-type ion exchange resins. The crosslinked polymers may contain functional groups (such as primary or secondary amino, carboxyl or sulfonate groups) that serve as initiation points for the deposition of the inorganic material. Several embodiments of the invention are useful in this application. In one embodiment, the catalytic material, which is typically a metal such as platinum, palladium, cobalt, zinc, magnesium, tungsten, and the like, is deposited onto the polymer substrate using ALD methods as described herein. An alumina, silica or other adhesion layer is preferred because metals tend to bind to alumina and silica surfaces well. The adhesion layer thus promotes the loading of the polymer particles with the metallic catalyst. Since atomic layer deposition is not line-of-sight dependent, it is possible for the coatings to be placed along the inner walls of pores within the catalyst particles. In other embodiments, an adhesion layer is deposited onto the polymer substrate as described before, and the catalytic material is deposited onto the coated polymer particles using some other technique. A chemical reaction is then conducted in the presence of particles coated with a metal that is a catalyst for the reaction. An example of such a reaction is a gas phase polymerization.

The inorganic material in many cases alters the surface properties of the polymer substrates without altering their bulk properties. For example, the coatings sometimes passivate reactive polymer surfaces and provide a barrier to protect the bulk materials or the contents within the bulk materials from the surrounding environment. If the coatings are placed on polymer particles, prior to fabricating components from the particles, it is possible for the coatings to be intimately blended in the polymer matrix and improve the properties of the fabricated component. Rather than strictly improved chemical effects, it is also possible for the coatings to provide desirable physical or structural property that the bulk material does not possess.

Polymer particles according to the invention can also be used to form coatings in flame spraying and other processes. Particles having $TiO_2$ coatings may act as photoinitiated catalysts to oxidize dirt deposits and provide a self-cleaning coating. Such particles may be used as a paint additive for that purpose. Particles having a metal coating can provide metallic and/or pearlescent effects for metallic finishes, and can be used as additives in paint formulations for that purpose. Particles having a variety of inorganic coatings can be used as additives for improving scratch and wear resistance in paints and coatings.

Coatings of particular interest are so-called "solventless" or "powder" coatings. In powder coating applications, a dry, particulate powder is applied to some substrate that is to be coated, and the applied powder is then melted to coalesce the particles into a smooth film. Specific applications include coating for wood furniture, prefinished wood floors, coatings for optical fibers, vinyl flooring covers, metal coatings (such as automobile exterior body parts), and glass coatings. Both thermoset and thermoplastic types are used, including polyurethanes, epoxies, polyesters, melamine-vinyl ether resins, and the like. In some cases, the film then undergoes a curing step, in which a chemical curing agent or energy (typically a source of heat or UV light) is applied in order to complete the curing of the film. Melting and/or curing is typically done at temperatures of 350-400° F., but due to safety and handling considerations, it is desirable to reduce those temperatures into the range of 250-300° F. It has been found that lower-curing powder coating materials tend to agglomerate when stored, even at ordinary room temperatures. This problem of low-temperature agglomeration is overcome using this invention. A continuous coating of an inorganic material, applied as described herein, effectively prevents the polymer particles from adhering to each other at low temperatures. Because the inorganic coating is extremely thin, it still allows the particles to melt together at higher temperatures to form a good quality film. In many cases where an inorganic pigment (such as $TiO_2$) is used in the coating formulation, the inorganic coating can double as a pigment, reducing or even eliminating the need for additional pigments to be added to the coating formulation.

In yet another application, a polymer film is coated with an alumina or other adhesion layer, and a titanium nitride or tantalum nitride layer is deposited, using ALD or other methods, onto the adhesion layer. The resulting structure is a useful polymer substrate for plastic microelectronic packaging. The titanium or tantalum nitride layer functions as a copper diffusion barrier. The inorganic layer may also facilitate the etching of metals more easily than could be achieved directly on the polymer surface. Other forms of microelectronic packaging can be made by depositing other inorganics onto a polymer film, with or without an adhesion layer.

The following examples are provided to illustrate the invention, and are not intended to limit the scope thereof. All parts and percentages are by weight unless otherwise indicated.

EXAMPLE 1

Low density polyethylene particles (LDPE) with a diameter of ~2 microns were mounted in a tungsten screen and positioned in a vacuum chamber designed for Fourier transform infrared (FTIR) experiments. The temperature of the LDPE particles is controlled by resistive heating of the tungsten screen.

The $Al_2O_3$ ALD was performed at 350 K, using the reaction sequence A1/B1 described above. FTIR was used to monitor the progress of the reactions. Prior to beginning the reaction sequence, the FTIR spectra of the LDPE particles exhibited prominent C—H stretching vibrations at 2960-2840 $cm^{-1}$ and the C—C stretching vibrations at 1465 $cm^{-1}$. Additional vibrational features attributed to the polyethylene hydrocarbon chains were observed at 720, 1110, 1300, and 1375 $cm^{-1}$. The LDPE particles were first exposed to $H_2O$ at 350 K Because of the hydrophobic nature of the LDPE particles, no vibrational features associated with $H_2O$, in particular the O—H vibrational stretching features, were observed by FTIR following the initial $H_2O$ exposure.

The LDPE particle is then exposed to the TMA reactant at 350K. The FTIR difference spectrum reveals new vibrations at ~2900 cm–1 that are assigned to the C—H stretching vibrations from the $CH_3$ species derived from TMA. The FTIR data confirms that TMA either adsorbs on the polyethylene particles or reacts with species on the polyethylene surface. When the particles are then exposed to water, the FTIR difference spectrum exhibits a new vibrational feature at 2900-3600 $cm^{-1}$ attributed to O—H stretching vibrations. In addition, the C—H stretching vibrations at ~2900 $cm^{-1}$ that were added by TMA were removed by the $H_2O$ reaction. The FTIR spectrum confirms that water has reacted with the TMA at the particle surface.

As the TMA/$H_2O$ cycles are continued, the growth of an $Al_2O_3$ bulk vibrational feature begins to appear at 500-950 $cm^{-1}$. This feature grows progressively as the reaction cycles are repeated, establishing that $Al_2O_3$ is being deposited on the LDPE particles.

Further confirmation of the deposition of an $Al_2O_3$ film on the LDPE particles is provided by transmission electron microscopy (TEM) images of the $Al_2O_3$-coated LDPE particles. TEM images recorded after 40 reaction cycles at 350 K indicate an $Al_2O_3$ film of between 150-200 Å was produced. This thickness was greater than expected after 40 AB cycles. This thicker $Al_2O_3$ film is attributed to the diffuse nature of the LDPE surface and near surface region. TMA is believed to diffuse into the polymer chain network near the surface of the LDPE particle. The TMA may simply be adsorbed in this region or may react with carbon radicals. Consequently the TMA becomes distributed over a relatively wide zone in the near surface region of the LDPE polymer, causing the deposited alumina film to be similarly formed over this wide zone.

EXAMPLE 2

The atomic layer deposition of $Al_2O_3$ on polymethyl methacrylate (PM), polyvinylchloride (PVC) and polypropylene (PP) was performed using quartz crystal microbalance (QCM) studies. QCM methods are very sensitive to mass and can easily measure mass changes of ~0.3 $ng/cm^2$ that correspond to the deposition of fractions of an atomic layer of $Al_2O_3$. By spin-coating various polymer films onto the QCM sensor, the adsorption of various chemical species can be measured accurately on polymer films. Likewise, the growth of thin films on polymer films can also be monitored with extreme precision.

The thickness of the PEA film on the QCM sensor used in this Example is 1300 Å. The $Al_2O_3$ ALD is performed at 86° C. using a $t_2$-$t_2$-$t_3$-$t_4$ pulse sequence of 1-20-1-20. $t_1$ is the trimethylaluminum (TMA) reactant pulse, $t_2$ is the purge time after the TMA pulse, $t_3$ is the $H_2O$ reactant pulse and $t_4$ is the purge time after the $H_2O$ pulse. All times are in seconds.

Mass measurements during the ALD process reveal a large mass increase during TMA reactant exposure. Subsequently, the mass decreases during the purge time after the TMA pulse. This mass decrease corresponds to the loss of some of the absorbed TMA. The mass decrease is stopped with the introduction of the $H_2O$ reactant pulse. However, there is no obvious increase in mass corresponding with the $H_2O$ reactant pulse, which is consistent with the replacement of —$CH_3$ groups with —OH groups.

The second TMA reactant pulse again leads to an increase in the QCM mass. Likewise, mass is lost during the purge after the second TMA pulse. The behavior following the second $H_2O$ reactant pulse is also similar. However, the total mass has increased following the second $H_2O$ reactant pulse.

This mass increase corresponds to the growth of Al$_2$O$_3$ on the PMMA polymer film. Subsequent TMA/H$_2$O reactant cycles display similar behavior. The total mass increases following each TMA/H$_2$O reactant cycle, indicating the growth of the Al$_2$O$_3$ layer. The pronounced mass increases during the TMA reactant exposures are progressively reduced in magnitude during the first 20 TMA/H$_2$O reactant cycles. After these 20 TMA/H$_2$O reactant cycles, only a small mass increase occurs during the TMA reactant pulse and no pronounced mass reduction occurs during the purge following the TMA reactant pulse. This behavior suggests that the Al$_2$O$_3$ ALD film deposited during the first 15-20 TMA/H$_2$O reactant cycles has formed a diffusion barrier at the PMMA polymer surface that impedes the diffusion of TMA into the polymer. Because the TMA can no longer penetrate into the polymer, it can only deposit at the surface. For that reason, TMA uptake becomes less as the number of reaction cycles increases. After about 20 TMA/H$_2$O reactant cycles, the growth of the mass with number of TMA/H$_2$O reactant cycles is essentially linear. This linear mass increase with number of TMA/H$_2$O reactant pulses will continue indefinitely with the repetitive pulse sequence because the Al$_2$O$_3$ film has formed a diffusion barrier on the PMMA polymer surface.

EXAMPLE 3

Example 2 is repeated, this time using a polypropylene film deposited on the QCM sensor at a thickness of ~6000 Å. The Al$_2$O$_3$ ALD is performed at 80° C., again using a $t_1$-$t_2$-$t_3$-$t_4$ pulse sequence of 1-20-1-20. Similar to the results in Example 2, the TMA reactant pulse leads to a large increase in the mass recorded by the QCM. The mass decreases during the purge following the TMA reactant pulse. This behavior is again explained as the diffusion of TMA into the PP polymer during the TMA reactant pulse. Subsequently, some of the TMA diffuses out during the purge following the TMA reactant pulse. Repeating TMA and H$_2$O reactant pulses leads to a progressive increase of mass associated with the growth of Al$_2$O$_3$. However, the magnitude of the mass increase during the TMA reactant pulses decreases versus number of TMA/H$_2$O reactant cycles. This decrease in magnitude is attributed to the growth of the Al$_2$O$_3$ ALD film. The Al$_2$O$_3$ ALD film serves as a diffusion barrier and impedes the diffusion of TMA into the PP polymer film. After ~15 TMA/H$_2$O reactant cycles, the mass increases very linearly with number of TMA/H$_2$O reactant cycles. The mass increase during the TMA reactant pulse becomes reduced. Both of these observations are consistent with an Al$_2$O$_3$ diffusion barrier being formed during the first 15 TMA/H$_2$O reactant cycles. Once the Al$_2$O$_3$ ALD diffusion barrier is established on the PP polymer surface, the Al$_2$O$_3$ ALD film grows linearly as expected for Al$_2$O$_3$ ALD on a flat oxide surface.

EXAMPLE 4

Example 2 is again repeated, this time using a polyvinylchoride (PVC) polymer film. Very similar behavior was observed in comparison to Al$_2$O$_3$ ALD on PMMA and PP as shown in Examples 2 and 3. The Al$_2$O$_3$ deposition was performed at 80° C. using a $t_1$-$t_2$-$t_3$-$t_4$ pulse sequence of 1-20-1-20.

The TMA readily diffuses into the PVC polymer during the TMA reactant pulse. However, in contrast to the results on PMMA and PP, the TMA does not diffuse out during the purge time after the TMA reactant pulse. This behavior indicates that TMA is more strongly absorbed by PVC than by PMMA or PP. Large amounts of TMA are absorbed during the initial TMA/H$_2$O reactant cycles. After approximately 15 TMA/H$_2$O reactant cycles, the large mass increases are no longer observed during the TMA reactant pulses. This behavior indicates that an Al$_2$O$_3$ diffusion barrier has been formed on the PVC polymer film. For additional TMA/H$_2$O reactant cycles, the mass increases linearly as expected for the growth of an Al$_2$O$_3$ ALD film.

The invention claimed is:

1. A method of forming a continuous inorganic alumina film on a polymer substrate material which does not contain functional groups, and mechanically interlocking the polymer substrate material and the alumina film, comprising:
   (a) contacting the polymer substrate material which does not contain functional groups with trimethyl aluminum or triethyl aluminium;
   (b) at a temperature below the temperature at which the polymer substrate material degrades, melts or softens enough to lose its physical shape, allowing the trimethyl aluminum or triethyl aluminum to diffuse into the polymer chain network of the polymer substrate material, without previously performing a precursor reaction to introduce functional groups onto the surface of the polymer substrate material, wherein the polymer substrate material is selected from low density polyethylene, linear low density polyethylene, substantially linear polyethylene, polypropylene, and polystyrene;
   (c) allowing the trimethyl aluminium or triethyl aluminium to be absorbed by the polymer chain network;
   (d) at a temperature below the temperature at which the polymer substrate material degrades, melts or softens enough to lose its physical shape, contacting the polymer substrate material surface with a gas-phase wetting reactant which reacts with the trimethyl aluminum or triethyl aluminum absorbed by the polymer chain network in step c, to form discontinuous inorganic deposits of alumina within the polymer chain network; and
   (e) repeating a reaction cycle comprising steps (a), (b), (c), and (d) until the mass of the polymer substrate material and alumina film increases linearly, evidencing that the discontinuous inorganic deposits of alumina have grown and interconnected to form a diffusion barrier comprising a continuous inorganic alumina film mechanically interlocked to the organic polymer substrate material, wherein steps (a)-(e) are performed at a temperature below 550K.

2. The method of claim 1, wherein the polymer substrate material is in the form of a film.

3. The method of claim 1, wherein the polymer substrate material is in the form of a particulate.

4. The method of claim 3, wherein the method is conducted by fluidizing a bed of the particulate polymer substrate material.

5. The method of claim 1, wherein an additional inorganic material is deposited over the continuous inorganic alumina film.

6. The method of claim 1, wherein the continuous alumina film is ultrathin and conformal.

7. The method of claim 6, wherein the continuous alumina film has a thickness of from 0.5 nanometer to 200 nanometers.

8. The process of claim 1, wherein the continuous inorganic alumina film formed in step e forms a diffusion barrier which prevents further penetration of the gas-phase wetting reactant into the polymer substrate material.

9. The process of claim 8, wherein, after step e, additional inorganic material is deposited onto the diffusion barrier formed by the continuous inorganic alumina film at the surface of the polymer substrate material by conducting a sequence of at least two self-limiting reactions via an atomic layer deposition process and at a temperature below 550K to deposit the inorganic material onto the surface of said polymer substrate material.

\* \* \* \* \*